(12) United States Patent
Wiberg et al.

(10) Patent No.: US 9,325,333 B2
(45) Date of Patent: Apr. 26, 2016

(54) FAST FREQUENCY ESTIMATOR

(71) Applicant: The Regents of the University of California, Oakland, CA (US)

(72) Inventors: Donald M. Wiberg, Santa Cruz, CA (US); Kenneth D. Pedrotti, Soquel, CA (US); Chengcheng Xu, Santa Cruz, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 14/767,553

(22) PCT Filed: Mar. 14, 2014

(86) PCT No.: PCT/US2014/029212
§ 371 (c)(1),
(2) Date: Aug. 12, 2015

(87) PCT Pub. No.: WO2014/144694
PCT Pub. Date: Sep. 18, 2014

(65) Prior Publication Data
US 2016/0006446 A1    Jan. 7, 2016

Related U.S. Application Data

(60) Provisional application No. 61/790,295, filed on Mar. 15, 2013.

(51) Int. Cl.
*H03L 7/24* (2006.01)
*G01R 23/02* (2006.01)

(52) U.S. Cl.
CPC . *H03L 7/24* (2013.01); *G01R 23/02* (2013.01)

(58) Field of Classification Search
CPC .......................................................... H03L 7/24
USPC .............................. 331/34; 329/304; 375/349
See application file for complete search history.

(56) References Cited

U.S. PATENT DOCUMENTS

| | | | | |
|---|---|---|---|---|
| 5,272,446 A * | 12/1993 | Chalmers | ............. | G01R 23/165 329/304 |
| 5,959,871 A | 9/1999 | Pierzchala | | |
| 2004/0125893 A1 | 7/2004 | Gazor | | |
| 2008/0273645 A1 | 11/2008 | Rahman | | |
| 2013/0322584 A1* | 12/2013 | Kumar | .................. | H04L 27/266 375/349 |

OTHER PUBLICATIONS

Dash et al. 2000. An extended complex kalman filter for frequency measurement of distorted signals. Sientific Journal IEEE 2000 pp. 1569-1574.

* cited by examiner

*Primary Examiner* — Joseph Chang
(74) *Attorney, Agent, or Firm* — Lumen Patent Firm

(57) ABSTRACT

In one aspect, the invention provides a method implemented by an analog hardware circuit for fast frequency estimation. The analog circuit may be implemented a main oscillator circuit block [100], a P matrix circuit block [102], a K matrix circuit block[104], and a sigma integrator circuit block [106]. From input signals [108] having unknown frequency, amplitude and phase, the analog hardware circuit generates estimates of state variables $x_1$, $x_2$, $x_3$ of a model oscillator, and outputs a sinusoidal estimate [110] of the model oscillator signal. The analog hardware circuit generates the estimates by implementing in continuous time an extended Kalman filter that relates a generating frequency 107 of the model oscillator to $x_3$ by an affine transformation $\omega=\omega_0+\pounds x_3$, where k is a slope of a frequency error estimate and coo is a best estimate input signal frequency.

16 Claims, 9 Drawing Sheets

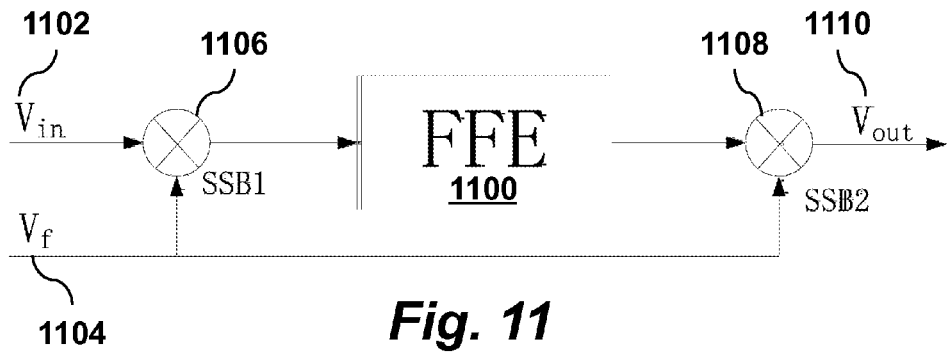

*Fig. 11*

1200
Receive by the analog hardware circuit input signals having unknown frequency, amplitude and phase

1202
Generate by the analog hardware circuit from the input signals estimates of state variables x1,x2,x3 of a model oscillator; by implementing in continuous time an extended Kalman filter

1204
Output by the analog hardware circuit a sinusoidal estimate of the model oscillator signal

*Fig. 12*

FAST FREQUENCY ESTIMATOR

CROSS-REFERENCE TO RELATED APPLICATIONS

This application is a 371 of PCT/US2014/029212 filed on Mar. 14, 2014. PCT/US2014/029212 filed on Mar. 14, 2014 claims the benefit of U.S. Provisional Application No. 61/790,295 filed on Mar. 15, 2013.

FIELD OF THE INVENTION

The present invention relates generally to signal processing. More specifically, it relates to improved circuits for frequency estimation.

BACKGROUND OF THE INVENTION

The problem of estimating and tracking the underlying, slowly time-varying frequency of a weak sinusoidal signal occurs in several areas of signal processing. There are a variety of known approaches to estimate the frequency of a harmonic signal. The straightforward approach of directly measuring the time difference between zero crossings and the number of cycles per second is very sensitive to noise in the signals. Approaches to overcome this problem have been proposed, such as techniques based on the Fourier transform, correlation, least square error techniques, recursive algorithms, chirp Z transform (CZT), adaptive notch filters, and Kalman filtering that estimates instantaneous frequency of the signal. In such problems the filter must deal with the inherent nonlinearity and also with extremely high noise levels. The Kalman filter is a recursive stochastic technique that gives an optimal estimation of state variables of a given linear dynamic system from noisy measurements. The Kalman filter gives a time-varying gain, which is not amenable to frequency domain analysis.

SUMMARY OF THE INVENTION

In one aspect, the present invention provides a method and circuit for frequency estimation, with applications to various problems such as clock and data recovery, or as a replacement for phase locked loops (PLLs) in many applications. The method is a modification of an extended Kalman filter frequency estimator (EKFFE) and is implemented as a high speed analog circuit. Functionality and stability in the face of various practical non-idealities (component matching, finite bandwidth, signal delay, missing symbols in a cyclostationary data stream, etc.) has been verified using MATLAB and SPICE simulations. It has greatly superior performance relative to PLLs with respect to acquisition time and range. In particular the EKFFE with no forgetting factor has an infinite acquisition range. The method and circuit are referred to herein as a fast frequency estimator (FFE). The implementation of the FFE has very fast convergence, very wide acquisition range, asymptotically optimal noise rejection, and great flexibility for many communications, computer, and other applications that would otherwise use a PLL.

Key features of the FFE fall include two broad categories: modification of the extended Kalman filter (EKF) algorithm and innovations in analog circuit design and implementation.

The modifications of the usual EKFFE equations to obtain the FFE algorithm include one or more of the following:
1. Modifications to allow proper implementation of the EKF in continuous time, rather than discrete time. These modifications eliminate round-off and quantization errors in tracking the sinusoidal signal wave.
2. Use of a balanced state space representation. The state space description of the harmonic oscillator that produces the frequency estimate has an $\omega$ and $-\omega$ on the off-diagonal elements, i.e., the matrix is balanced in the magnitude of its elements. Other basis states can be used for the state space representation as well.
3. Affine transformation of the frequency variable. This transformation of the estimated variable centers the frequency estimate about a best estimate, $\omega_0$, of the input frequency, leads to superior dynamic range, and gives design flexibility in the choice of the chosen slope, k, of the frequency error estimate.
4. Limiting the error variance matrix P of the EKFFE to the cone of positivity. (The cone of positivity of a positive definite matrix is the domain of values of its elements such that the matrix remains positive definite.) Large noise amplitudes introduce great deviations in the innovations sequence, which can drive the extended state error variance out of the cone of positivity leading to instability. Methods to limit to the cone can be different for each application.

The circuit implementation includes one or more of the following features:
1. Realization of a transconductor-based circuit suitable for high speed operation using modern metal-oxide-semiconductor (CMOS) integrated circuit (IC) technologies.
2. Ability to maintain a high Q main oscillator in the face of finite component losses.
3. Ability to control of the needed component matching tolerances while simultaneously maintaining the high Q of the main oscillator.
4. Ability to incorporate forgetting factors for control circuit dynamics and to allow for relaxed matching requirements.
5. Ability to provide broadband acquisition and narrowband tracking of the clock.

Although the use of the extended Kalman filter for the extraction of a sine wave signal from noise is known in digital form, it was widely considered to be discredited. The analog implementation of the present invention overcomes these problems.

The FFE can be used in a broad variety of applications, including clock and data recovery in communication systems, serial data links and computers; signal recovery in communications; signal demodulation and modulation in communication systems; high fidelity audio; phased array radar, AC motor control, and active vibration suppression. The fast frequency estimator can be adapted in design for each application, in accordance with the principles of the invention.

In one aspect, the invention provides a method implemented by an analog hardware circuit for fast frequency estimation. The method includes receiving by the analog hardware circuit input signals having unknown frequency, amplitude and phase. From these input signals, the analog hardware circuit generates estimates of state variables $x_1$, $x_2$, $x_3$ of a model oscillator, and outputs a sinusoidal estimate of the model oscillator signal. The analog hardware circuit generates the estimates by implementing in continuous time an extended Kalman filter that relates a generating frequency w of the model oscillator to $x_3$ by an affine transformation $\omega = \omega_0 + kx_3$, where k is a slope of a frequency error estimate and $\omega_0$ is a best estimate input signal frequency.

Preferably, the extended Kalman filter uses a balanced state space representation in continuous time, and an error variance matrix P of the extended Kalman filter is limited to a cone of positivity.

The analog hardware circuit may be implemented using a main oscillator circuit block, a P matrix circuit block that produces an error covariance of the state variable estimates, a K matrix circuit block that produces an optimal Kalman gain, and a sigma integrator circuit block that produces a variance of $x_3$.

The analog hardware circuit may be realized as a CMOS IC and may use transconductance amplifiers and transconductance multipliers to implement analog computations.

In some embodiments, the analog hardware circuit may also receive a forgetting factor (bandwidth) control signal, and/or output a voltage proportional to a frequency estimate.

In some embodiments, the extended Kalman filter includes a forgetting factor matrix in a Riccati equation, an additional $\epsilon$ term in an A matrix of a Riccati equation, and/or a frequency update equation including a damping factor $\rho$.

In some embodiments, the analog hardware circuit has multiple FFE and additional subcircuits connected to each other in series, in parallel, or in a combination of series and parallel, where each FFE separately performs the frequency estimation. For example, the input signals may have multiple unknown frequencies, and the circuit outputs multiple sinusoidal estimates of model oscillator signals corresponding to the input signals. Alternatively, the circuit may receive multiple input signals having respective unknown frequencies, amplitudes, and phases. Multiple sinusoidal estimates of model oscillator signals corresponding to the multiple input signals are then generated by the circuit.

In some embodiments, the analog hardware circuit may include an input mixer that frequency down-converts the input signals, and an output mixer that frequency up-converts the sinusoidal estimate, thereby extending the frequency range of the circuit.

In some embodiments, the extended Kalman filter uses alternate state variables and nonlinear transformations of frequency, amplitude and phase.

These and other features of the invention are described and illustrated below.

BRIEF DESCRIPTION OF THE DRAWINGS

FIG. 11 is a functional block diagram illustrating how mixers may be used to frequency-convert input and output signals to a frequency estimation circuit, according to an embodiment of the invention.

FIG. 12 is a flow chart outlining main steps of a method of frequency estimation, according to an embodiment of the invention.

DETAILED DESCRIPTION

Figure 1:
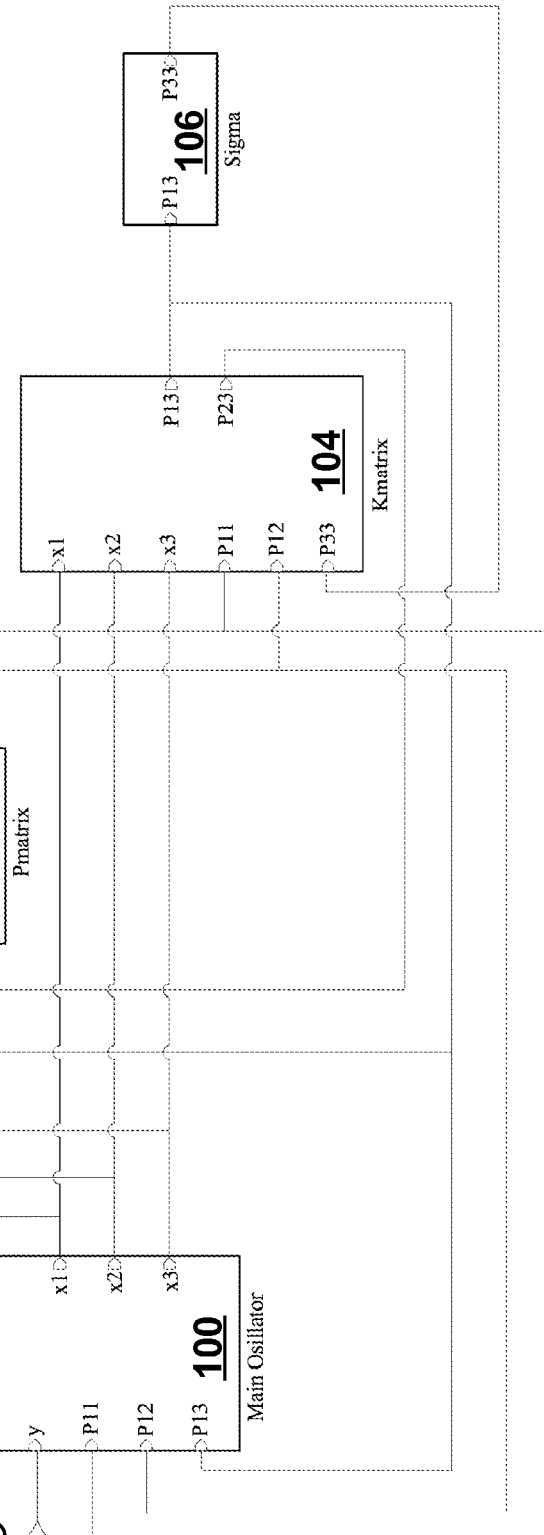
FIG. 1 is a block diagram of a frequency estimation circuit including the main oscillator block and the blocks for the calculation of the P matrix and K matrix, according to an embodiment of the invention.

According to one embodiment, a circuit is provided that can serve as a replacement for phase locked loops (PLLs) in many applications. For purposes of illustration, this embodiment focuses on a high speed analog implementation and its use for clock and data recovery in high-speed applications. The circuit design is based on an implementation of a modified extended Kalman filter using a balanced state space representation. Accordingly, the description below begins with a discussion of the extended Kalman filter, its modification, and the relevant domains of application: PLLs and clock and data recovery (CDR).

The FFE of the present invention performs many of the same functions that the ubiquitous phase-locked loop does. Both the FFE and PLL "lock" their outputs to an incoming sinusoidal wave in the presence of noise. We will compare the performance of these two devices here later.

The PLL is used in many applications, such as clock and data recovery, clock de-skewing, clock generation, spread spectrum, clock distribution, jitter and noise reduction, and frequency synthesis. The FFE provides superior performance in many of the same applications as the PLL. Here we show how the FFE can serve as a PLL replacement in the CDR application, other applications will be described below.

CDR techniques are commonly used to recover the clock signal of a high-speed serial data stream, such as when reading a raw data stream from a mechanical data storage device. The CDR recovers a clock signal to allow accurate reading of the data.

The Kalman filter is a recursive stochastic technique that gives an optimal estimation of state variables of a given linear dynamic system from noisy measurements. The Kalman filter gives a time-varying gain, which is not amenable to frequency domain analysis. Embodiments of the present invention are based on a modification of an extended Kalman filter that is applicable to the non-linearity of its state space representation in order to estimate and track frequency in extremely high noise levels.

A model of the harmonic oscillator generating the sinusoidal wave y(t) at frequency ω and phase ϕ at time t is represented in state space notation as follows:

$$x = \begin{pmatrix} x_1 \\ x_2 \end{pmatrix} = \begin{pmatrix} \sin(\omega t + \varphi) \\ \cos(\omega t + \varphi) \end{pmatrix} = \begin{pmatrix} \sin((\omega_0 + k \cdot x_3)t + \varphi) \\ \cos((\omega_0 + k \cdot x_3)t + \varphi) \end{pmatrix}$$

$$\omega = \omega_0 + k \cdot x_3$$

$$y(t) = x_1(t) + v(t)$$

where v(t) is zero mean white Gaussian measurement noise with variance R.

Note that here the generating frequency ω of the harmonic oscillator is expressed as an affine transformation of the third (extended) state $x_3$. Therefore, the state space representation is non-linear in $(x_1, x_2, x_3)$ although it is linear in terms of $(x_1, x_2)$ with constant $x_3$. Thus, ω is expressed in terms of designer chosen constants $\omega_0$, the nominal frequency estimate, and k, the gain (slope) of the affine transformation. The designer constant $\omega_0$ is chosen to be the best estimate, i.e., conditional mean of its conditional probability distribution if known, of the input sinusoidal frequency. The designer constant k is a slope value chosen to scale the voltages in the P matrix and K matrix blocks. This affine transformation of the third (extended) state $x_3$ is a key to the approach and does not appear to have been used before: In prior work for the EKFFE, ω is the extended state $x_3$ with no affine transformation. The EKFFE having the above affine transformed representation of the harmonic oscillator is $$\frac{d\hat{x}'}{dt} = \frac{d}{dt}\begin{pmatrix} \hat{x}_1 \\ \hat{x}_2 \\ \hat{x}_3 \end{pmatrix} = f(\hat{x}') + K \cdot (y - \hat{x}_1)$$

$$K = PC^T R^{-1} = R^{-1} \cdot \begin{pmatrix} P_{11} \\ P_{12} \\ P_{13} \end{pmatrix}$$

$$\frac{dP}{dt} = F \cdot P + P \cdot F^T - PC^T R^{-1} CP$$

$$= (F_0 + k \cdot F_1) \cdot P + P \cdot (F_0 + k \cdot F_1)^T - P \cdot C^T \cdot R^{-1} \cdot C \cdot P$$

$$= F_0 \cdot P + P \cdot F_0^T + k \cdot F_1 \cdot P + k \cdot P \cdot F_1^T - P \cdot C^T \cdot R^{-1} \cdot C \cdot P$$

$$f(x') = \begin{pmatrix} (\omega_0 + k \cdot x_3)x_2 \\ -(\omega_0 + k \cdot x_3)x_1 \\ 0 \end{pmatrix}$$

$$C = (1 \quad 0 \quad 0)$$

$$F = \frac{\partial f(x')}{\partial x'}\bigg|_{\hat{x}} = \begin{pmatrix} 0 & \omega_0 \cdot k \cdot \hat{x}_3 & k \cdot \hat{x}_2 \\ -\omega_0 - k \cdot \hat{x}_3 & 0 & -k \cdot \hat{x}_1 \\ 0 & 0 & 0 \end{pmatrix} =$$

$$\begin{pmatrix} 0 & \omega_0 & 0 \\ -\omega_0 & 0 & 0 \\ 0 & 0 & 0 \end{pmatrix} + k \begin{pmatrix} 0 & \hat{x}_3 & \hat{x}_2 \\ -\hat{x}_3 & 0 & -\hat{x}_1 \\ 0 & 0 & 0 \end{pmatrix} = F_0 + k \cdot F_1$$

where f( ) is the nonlinear state space update to the nonlinear model derivative of the state vector, i.e., dx/dt=f(x) in the 3-vector model for the extended Kalman filter. Then $x_3$ is the frequency, $\omega = x_3$, appended to the state vector of the harmonic oscillator, whose states $x_1$ and $x_2$ are the instantaneous quadrature variables producing the sinusoidal input. Then $dx_3/dt=0$ if the frequency does not change with time in the model. The variables $\hat{x}_1$ $\hat{x}_2$ $\hat{x}_3$ are the estimates of the state, P is a 3×3 matrix of variance estimates, K is a 3-vector representing the Kalman filter gain, and C is the output map, a 3 vector transposed, from the state vector to the output. P is a 3×3 matrix whose elements are the estimates of the variance of the state vector errors. R has been defined as the scalar zero mean white noise variance that corrupts the input. Finally, F is the partial derivative 3×3 matrix of f with respect to x, and is broken up into the sum of $F_0$ and $kF_1$, which defines $F_0$ and $F_1$.

Except with the error variance 3×3 matrix P restricted to the cone of positivity as explained below, the above equations are implemented in analog hardware. This hardware corresponding to the above equations with a restriction on P makes the modified EKFFE above into what we call the fast frequency estimator (FFE). In the following, we will distinguish between the usual EKFFE with no affine transformation and our approach with the affine transformation and the limitation of P to the cone of positivity, which we will refer to as the FFE.

Following are some of the key features and associated advantages of the FFE technique. The alterations to the usual EKFFE equations to obtain the FFE algorithm include the following:

1. Design and implementation in continuous time, rather than discrete time. This eliminates round-off and quantization errors in tracking the sinusoidal signal wave. Although some prior work has considered continuous time, it was limited to damping and no noise for the general EKF.
2. Use of SPICE, rather than SIMULINK, to simulate the results. This eliminates problems with the ordinary differential equation (ODE) solvers. To our knowledge, no one has published a circuit diagram implementing the EKFFE in continuous time.
3. Use of a balanced state space representation. This minimizes the error propagation. Prior work considers a balanced state space representation, but only in discrete time.
4. Affine transformation of the frequency variable. This is a key contribution. This transformation of the estimated variable centers the frequency estimate about the best estimate of the input frequency $\omega_0 + kx_3$ and gives design flexibility in the choice of the chosen slope, k, of the frequency error estimate.
5. Limiting the error variance matrix P of the EKFFE to the cone of positivity. Large noise amplitudes introduce great deviations in the innovations sequence, which can drive the extended state error variance 3×3 matrix P out of the cone of positivity, which causes instability. Prior work has used methods of restricting parameters to known sets as "projections", in the general case of parameter estimation. In our case of estimation of frequency, methods to limit P to the cone of positivity are different for each application. Such methods include:
   A. No limitation at all, which is possible in many applications
   B. Use of a limiter on the diagonal elements of the variance matrix P constraining them to be positive, and
   C. In addition to B above, also the principal minors of the P matrix should be positive, which can also be added easily with a few additional circuit elements.

For parameter estimation applied to the frequency estimation problem, the EKFFE may be used to extend prediction error methods. Almost all of the parameter estimation algorithms studied theoretically to date assume asymptotic stability of the signal generating system. The harmonic oscillator generating the sine wave input to the EKFFE is merely semi-stable (poles on the j-ω axis) and so is not amenable to the historic form of analysis. If this semi-stable case of the harmonic oscillator can be considered as asymptotically stable, then the proven properties would be as follows:

1. Fast convergence. With no forgetting factor, convergence is with probability one to the true value of the frequency. With a small forgetting factor, convergence is to the true value plus a small noisy error whose amplitude increases with forgetting factor magnitude. Generally, convergence is within a cycle, and even faster with a forgetting factor. For example, frequencies at one GHz can be estimated generally within one nanosecond.
2. There is a trade-off between forgetting factor magnitude and quickness of ability to adjust to changes in carrier frequency. With no forgetting factor, no changes in frequency can be detected. By the law of large numbers of data, the frequency estimate eventually converges to a single true frequency number. If the carrier frequency changes, and a forgetting factor is incorporated, the forgetting of some past data is facilitated. Then carrier frequency changes can be detected easily in a time period that depends on how much past data is forgotten, but the accuracy of the frequency estimate suffers with the corresponding loss of data.
3. Global convergence from any positive initial guess for the frequency estimate to the true value with probability one (infinite pull-in range) with no forgetting factor.
4. Ease of incorporation of a forgetting factor by adding a pseudo process noise term to the error variance equation.
5. Optimal asymptotic noise response to a Gaussian white noise measurement disturbance.
6. Robustness about equivalent to an asymptotic least squares fit of the data, which is distribution independent.
7. The ease of dealing with a Kalman filter, about which much is known. The FFE can be incorporated into any Kalman filter setting such as colored measurement noise or non-zero process noise.
8. Equivalence to the Wiener filter in the steady state case, resulting in time-invariant components when a constant forgetting factor is used.

The above properties are confirmed in simulations performed by the inventors.

To implement FFE equations in an analog circuit, both sides of the equations are multiplied by a constant value C corresponding to a capacitance value. A capacitor of value C provides a voltage v(t) input to obtain a current i(t) output according to Cdv(t)/dt=i(t). Then the equations are implemented using capacitors to perform the differentiations in the equations. Circuitry that implements this system of equations can then be designed using analog multipliers, summing and differencing amplifiers and integrators. Rather than implementing the FFE digitally using analog-to-digital (A/D) and digital-to-analog (D/A) devices, the entire system is preferably implemented in analog form, as given below, for use in high-speed communication and computing systems.

$$\frac{d}{dt}\begin{pmatrix}\hat{x}_1\\ \hat{x}_2\\ \hat{x}_3\end{pmatrix} = \begin{pmatrix}(\omega_0 + k\cdot\hat{x}_3)\hat{x}_2\\ -(\omega_0 + k\cdot\hat{x}_3)\hat{x}_1\\ 0\end{pmatrix} + K(y - \hat{x}_1),\ K = R^{-1}\cdot\begin{pmatrix}P_{11}\\ P_{12}\\ P_{13}\end{pmatrix}$$

$$\frac{dP_{11}}{dt} = 2\cdot P_{12}\cdot(\omega_0 k\hat{x}_3) + 2\cdot k\cdot P_{13}\cdot\hat{x}_2 - R^{-1}\cdot P_{11}^2$$

-continued $$\frac{dP_{12}}{dt} = (P_{22} - P_{11})\cdot(\omega_0 + k\hat{x}_3) + k\cdot(P_{23}\cdot\hat{x}_2 - P_{13}\cdot\hat{x}_1) - R^{-1}\cdot P_{11}\cdot P_{12}$$

$$\frac{dP_{22}}{dt} = -2\cdot P_{12}\cdot(\omega_0 + k\hat{x}_3) - 2\cdot k\cdot P_{23}\cdot\hat{x}_1 - R^{-1}\cdot P_{12}^2$$

$$\frac{dP_{13}}{dt} = P_{23}\cdot(\omega_0 + k\hat{x}_3) + k\cdot P_{33}\cdot\hat{x}_2 - R^{-1}\cdot P_{11}\cdot P_{13}$$

$$\frac{dP_{23}}{dt} = -P_{13}\cdot(\omega_0 + k\hat{x}_3) - k\cdot P_{33}\cdot\hat{x}_1 - R^{-1}\cdot P_{12}\cdot P_{13}$$

$$\frac{dP_{33}}{dt} = -R^{-1}\cdot P_{13}^2$$

In the above equations, R is not necessarily the measurement noise variance, but a suitably chosen constant to scale the electronics. The equations above are optimal for the detection of the frequency, phase, and amplitude of any sinusoid in additive zero mean white noise, regardless of the noise amplitude. The only effect of R on the dynamics of the FFE is to scale the initial conditions. R is chosen to scale the voltages in the P and K matrix blocks appropriately.

A key to the operation of the FFE at high speeds is its implementation in high speed dedicated circuitry rather than by using a general purpose processor. Many of the most interesting applications, particularly in communications systems, are in the 100 MHz to 10 GHz frequency range. Some typical applications in communications are for carrier phase and frequency tracking, chip synchronization in spread spectrum systems, and signal synchronization. To achieve such speeds, analog circuit techniques are used. When implemented in analog circuitry, numerous non-idealities are manifest that do not affect digital implementations. Among these are device non-linearity, time-varying device properties, energy loss, complicated dynamic response, signal delay, temperature sensitivity, device matching, device properties shifting due to aging, additional noise sources, losses and the unwanted coupling of signals between circuit nodes via the substrate and parasitics.

FIG. 1 illustrates an instantiation of the FFE using high speed analog circuit blocks. It includes a main oscillator block 100, a block for the calculation of the P matrix 102, a block for the calculation of the K matrix 104, and a sigma calculation block 106. The circuit outputs a frequency estimate 110 of the signal input 108. This circuit implements the full set of equations for the FFE with the voltages at various nodes representing the signals within the FFE. The analog circuit includes transconductance amplifiers ($G_m$) which can be conveniently realized in modern CMOS integrated circuit processes and are capable of high-speed operation. The use of transconductors also allows the convenient summing of signals in the current domain and allows for better dynamic range relative to signal addition via stacked voltages. Transconductors are also much faster than a typical op-amp based summing amplifier. The key block is the main oscillator 100 which in general will be provided with signals to make it track the incoming signal while rejecting noise. For the CDR application the output 110 of the main oscillator is the recovered clock of the input signal 108.

Figure 2:
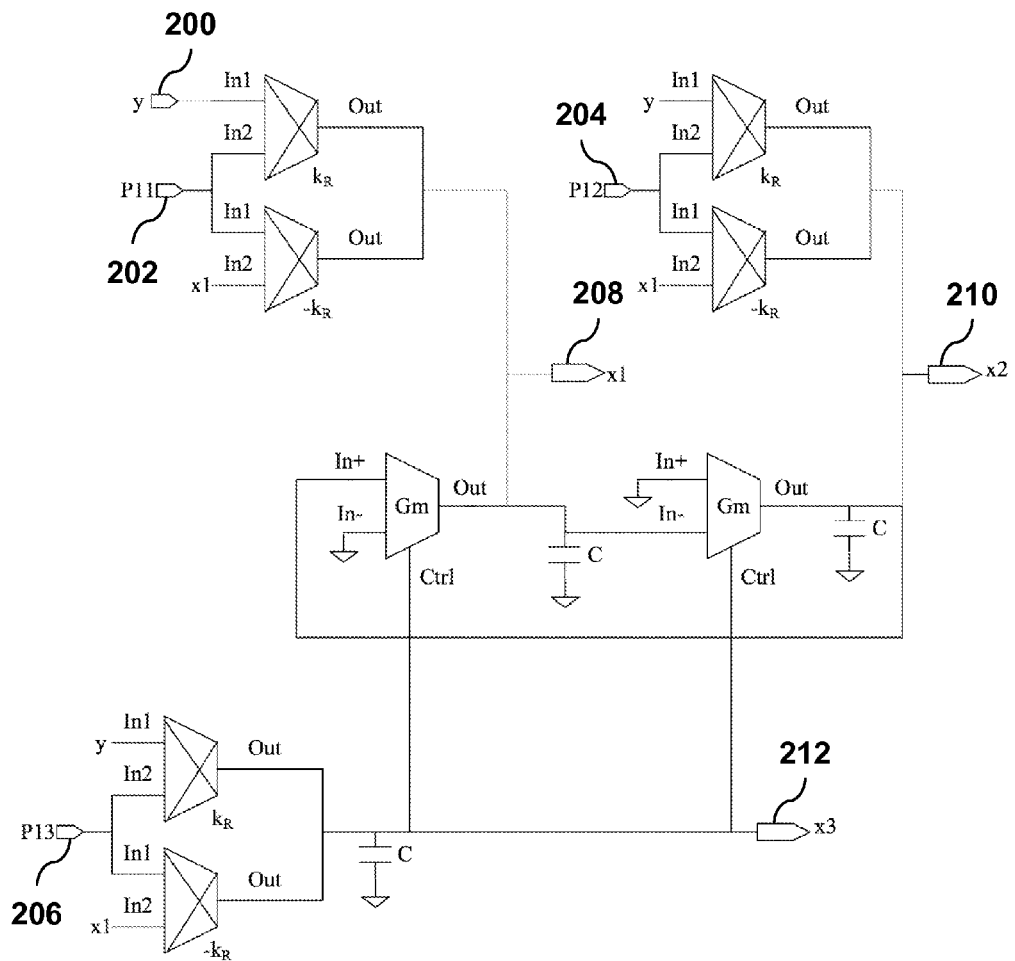
FIG. 2 is a circuit diagram illustrating details of the main oscillator of FIG. 1 implemented using transconductance amplifiers and transconductance multipliers, according to an embodiment of the invention.

FIG. 2 shows one implementation of the main oscillator block (100 of FIG. 1) with its associated inputs and outputs, namely, signal input y 200, P matrix elements $P_{11}$ 202, $P_{12}$ 204, $P_{13}$ 206, and state variables $x_1$ 208, $x_2$ 210, and $x_3$ 212. The advantage of this implementation is that it allows access to all the needed state variables and clear points for the injection of the signals required for the implementation of the FFE algorithm. The main oscillator block 100 is implemented using transconductance amplifiers and transconductance multipliers (depicted as isosceles trapezoids in the figures).

Figure 3:
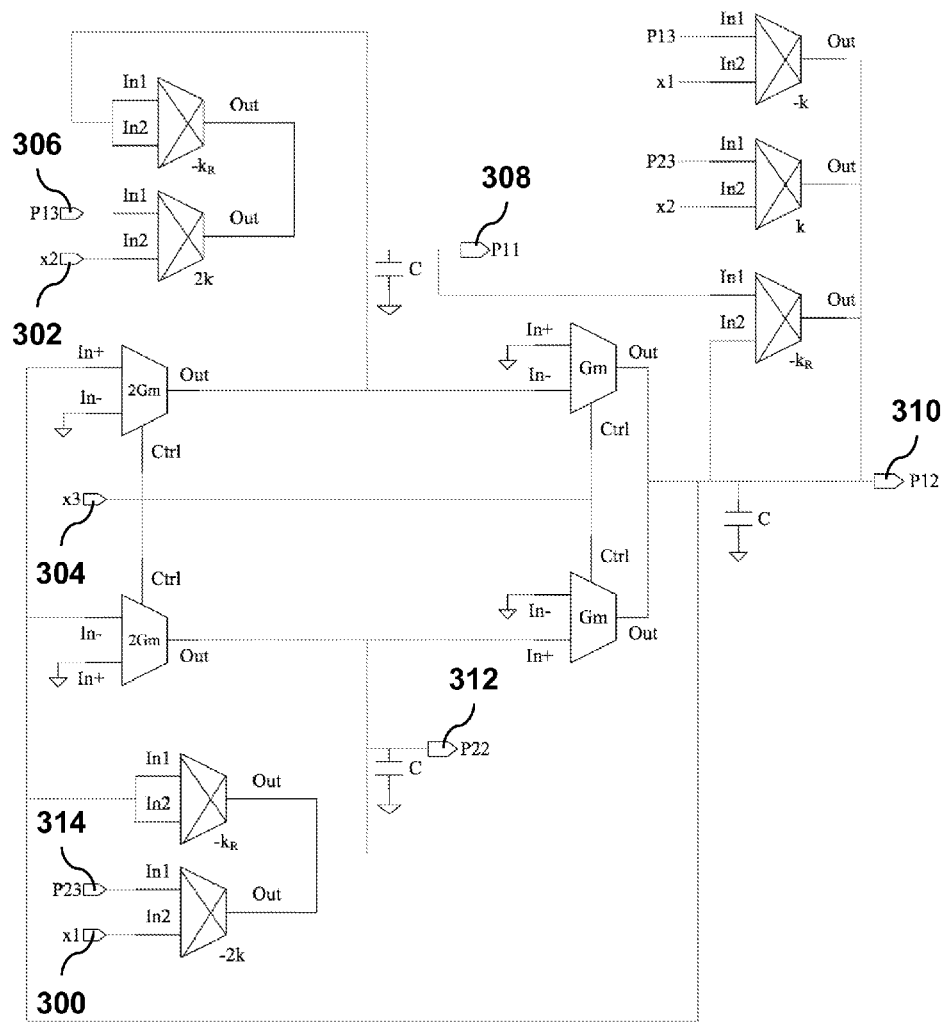
FIG. 3 is a circuit diagram illustrating details of analog circuitry used to implement the P matrix calculation block of FIG. 1, including controllable trans conductors, capacitors and multipliers, according to an embodiment of the invention. This too can be regarded as the implementation of an oscillator.

FIG. 3 illustrates an analog circuitry implementation of the P matrix calculation (block 102 of FIG. 1), including controllable transconductors, capacitors and multipliers. This too can be regarded as the implementation of an oscillator. Inputs and outputs include state variables $x_1$ 300, $x_2$ 302, and $x_3$ 304, and P matrix elements $P_{13}$ 306, $P_{23}$, 314, $P_{11}$ 308, $P_{12}$ 310, $P_{22}$ 312.

Figure 4:
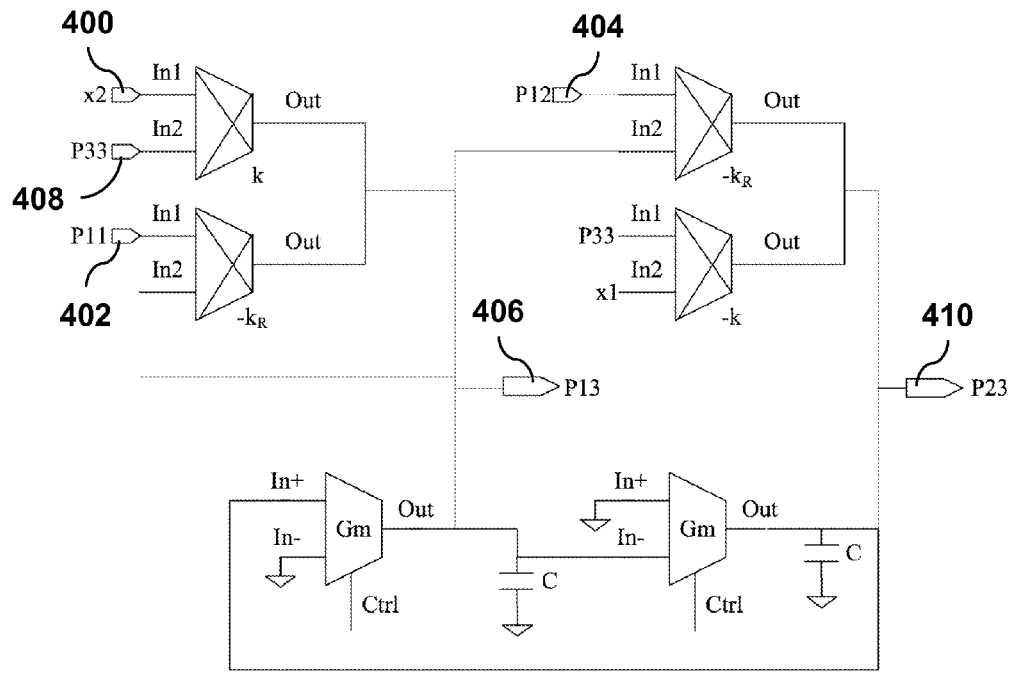
FIG. 4 is a circuit diagram illustrating details of analog circuitry used to implement the K matrix block of FIG. 1, according to an embodiment of the invention.

FIG. 4 illustrates an analog circuitry implementation of the K matrix (block 104 of FIG. 1), including controllable trans conductors, capacitors and multipliers. Inputs and outputs include state variable $x_2$ 400, and P matrix elements $P_{11}$ 402, $P_{12}$ 404, $P_{13}$ 406, $P_{33}$ 408, $P_{23}$ 410.

Figure 5:
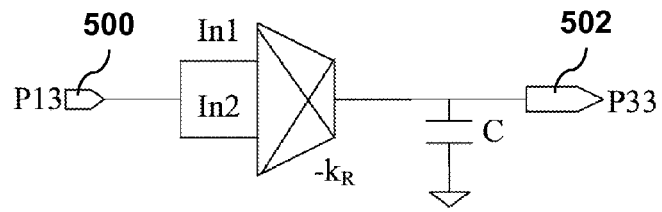
FIG. 5 is a circuit diagram of a sigma integrator that produces variance $P_{33}$ of the frequency estimate signal $x_3$, according to an embodiment of the invention.

FIG. 5 illustrates an analog circuitry implementation of the sigma integrator (block 106 of FIG. 1) that produces from $P_{13}$ 500 variance $P_{33}$ 502 of the frequency estimate signal $x_3$.

The performance of this approach has been verified by the inventors using a quasi-continuous time model in MATLAB. In addition, simulations using a behavioral level circuit model in SPICE were used to investigate the robustness of this approach to various practical non-idealities that arise in a high-speed analog implementation. These simulations verify the robustness of this approach and demonstrate its many advantages and superior performance relative to PLLs. This simulation also helps to identify implementation issues that are most critical to the maintenance of the robustness and stability of the circuit implementation.

The efficacy and verification of the algorithm was tested using MATLAB where resolution in both amplitude and time was kept sufficiently small as to be quasi-continuous. This is a rapid and accurate approach that allows the effects due to the algorithm to be distinguished from variation from this ideal formulation induced by its implementation in analog circuitry.

A MATLAB simulation was used to verify algorithm convergence and demonstrate that convergence was robust. In particular, the FFE was demonstrated to have stability with the addition of alterations including the affine transformation and the inclusion of a forgetting factor. With the forgetting factor, the FFE was shown to be capable of following changing waveforms with a controllable time constant. This for instance allows the slow changes in the underlying clock signals to be followed but the high speed jitter to be ignored in the CDR application.

FIGS. 6A-F are graphs of voltage vs. time produced by MATLAB simulation. The graphs show some of the key signals in the FFE, showing the extremely fast convergence even in the presence of significant noise on the input signal.

Figure 6A:
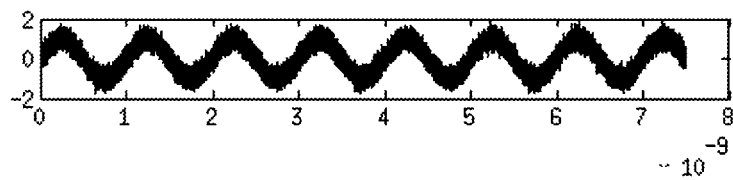
FIGS. 6A-F are graphs of MATLAB simulation results showing some of the key signals in a frequency estimation circuit showing the extremely fast convergence even in the presence of significant noise on the input signal, according to an embodiment of the invention.
Figure 6B:
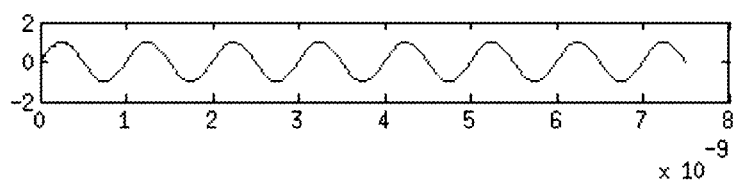
Figure 6C:
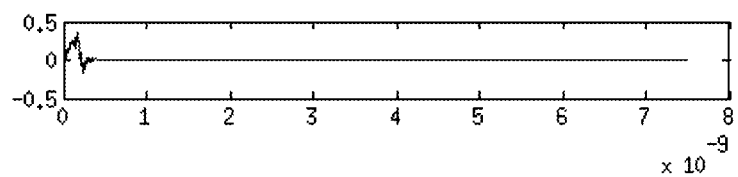
Figure 6D:
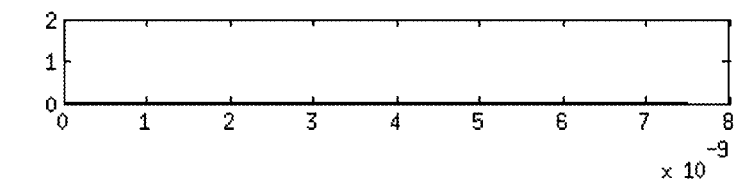
Figure 6E:
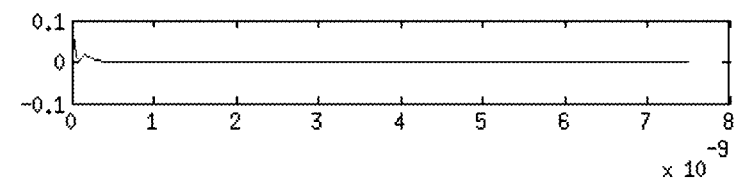
Figure 6F:
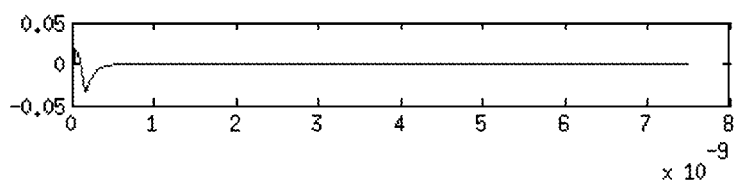

The figures show some of the signal voltages and convergence in the face of additive white Gaussian noise simulated in the time domain. FIG. 6A shows the input signal which is corrupted by noise. FIG. 6B is the estimated signal. This is the signal that would, for instance, constitute the recovered clock in a CDR block. FIG. 6C is the estimated frequency signal. It is important to note that in analog implementations and with the inclusion of the forgetting factor and losses, this loses its identity as a true reflection of the actual frequency of the estimated signal in the trace above it. In particular this voltage can have a variety of values and offsets and yet the frequency of the estimated signal remains unchanged. FIGS. 6D, 6E, 6F show, respectively, the intermediate signals for $P_{11}$, $P_{12}$, and $P_{13}$. FIGS. 6A-F demonstrate the extremely short time associated with the acquisition transient. In a normal PLL the acquisition time is a function of the loop bandwidth which is typically very small if filtering over many cycles is desired for jitter reduction. Here, for the FFE even with no forgetting factor, which leads to the equivalent of the most highly filtered signal, the circuit acquires lock very rapidly. This is one of the salient features of the FFE: it is capable of very fast signal acquisition while simultaneously acting like a narrow bandwidth PLL tracking some and rejecting other signal variations. As one adds a forgetting factor the system adapts even more rapidly to input signal changes which corresponds to even wider loop bandwidths. This behavior makes this circuit particularly attractive for burst-mode clock and data recovery applications.

In a conventional PLL the pull-in range is also related to the loop bandwidth. With the FFE this strict relationship is broken. The system will typically lock on to the input signal very rapidly (with no analogy to the pull-in phenomena observed in PLLs) and over a large range of input frequencies independent of the forgetting factor used. Practically speaking the range of the frequency control voltage may be limited to restrict the frequency range over which locking can occur. This is useful, for example, to insure that the system does not lock on to harmonics in the input signal.

Simulation in MATLAB also confirms that the FFE can be configured by the proper choice of forgetting factor and of its frequency response range to respond only to the clock signal underlying cyclo-stationary random binary data streams and to, for instance, reject the rapid variations due to the modulation yet track the signal as needed to follow drifts in the transmission media or in the transmitting system.

The behavioral model described above was used to simulate the effect of some of the real-world circuit issues on the performance of this circuit. Perhaps of foremost importance was to ascertain what the high frequency performance of the circuit was.

To investigate this the transconductors were altered so that they each had a single pole roll-off. The simulation demonstrated that circuit function was possible up to roughly 1/10 of the bandwidth. For modern CMOS circuits with transition frequencies (fTs) in the 100's of GHz this indicates that this circuit is suitable for high-speed applications.

In practice, a physical circuit implementation may introduce limitations not present in the mathematical ideal. The inventors have investigated those potential issues that appear to be the most important and have verified functionality over reasonable ranges likely to be practically encountered.

One such issue is the potential inability to avoid loss, particularly in the main oscillators. This would yield oscillators with finite Q that will forget their state in roughly 1/Q cycles. We have verified that the FFE circuit remains functional even down to fairly low assumed oscillator Q. The effect of finite Q is to provide loss to the system. This is incorporated the system model by alterations in the A matrix described below. The Q of each of the oscillators can be adjusted by intentionally adding resistance to lower the Q or by adding negative resistance to raise its effective Q.

For the circuit to track the transient behavior of the incoming signal, a forgetting factor is used. This forgetting factor is the addition of a pseudo process noise variance matrix to the Riccati equation of the FFE. From simulation it is found that adjustment of oscillator Q and the forgetting factor in the frequency integrator (FIG. 5) allows the control of the temporal dynamics of the circuit. The inventors have found a number of implementations that can be used to add the forgetting factor to the frequency estimation signal, such as the following. One is the use of a current source to charge the integrator at a desired rate. We note that the dynamics of this circuit are thus easily varied and even made dynamically adjustable. Similar sources can implement other forgetting factors in the computation of the other P matrix elements.

Another implementation is the use of an offset at the signal output. Although this causes an intentional error in the frequency estimate signal, the circuit maintains frequency lock on the input signal but now has a static phase error. Offsets at other points in the circuit can be used to implement forgetting factors for other circuit states.

Another practical aspect of this FFE circuit is consideration of restricting the range over which the main oscillator can operate. With too wide a range of permitted values of the estimated frequency, the FFE will pick out not just the desired clock frequency component but will actually follow the modulation components as well. The effective operation range can be dynamically adjusted by restricting the range of the $x_3$ signal. This eliminates any unwanted frequency components. We note that this effectively implements a dynamically tunable filter with an almost brick wall response.

A consequence of an analog implementation of the FFE is the inevitable occurrence of component mismatches and propagation delays. The most stringent matching requirement we have found is that among the 3 oscillators that define this system. We have found that at least one should have a finite Q and that for a Q of 100 the matching should be within around 1%. This should be realizable in CMOS but with perhaps some added cost in size and power. Alternately, to reduce these restrictions or to allow the use of higher Q, calibration or dynamic matching can be used to meet the matching requirements. The other main sensitivity is to delay; it was found that the circuit remains stable for delays less than roughly the period of the estimated signal.

In view of the above, the circuit as designed may be fabricated on a chip without any breadboard fabrication. The circuit is robust to these inevitable variations within acceptable limits and successful chip performance is to be expected for any application, especially clock and data recovery.

The FFE circuit is realizable in most any electronic technology that is capable of linear operation. For example, it may be realized using NMOS, PMOS, CMOS, BJT processes, BiCMOS, silicon on insulator processes, heterojunction bipolar processes, SiGe, SiGe/BiCMOS, AlGaAs/GaAs, SiN, SiC, AN, thin film transistors, or organic semiconductor processes. Additionally, in principle the FFE could be assembled on boards or in multichip modules from discrete or smaller scale integrated circuits implementing the sub-blocks using devices from any one of these processes or any combination thereof.

In the course of the implementation of the circuit for various specific applications a number of considerations arise.

The major top-level adaptation is the adjustment of the forgetting factor to control the circuit dynamics and to achieve the needed tolerance to device property mismatch. This adjustment can be dynamically controlled by an external input to the circuit or fixed at the time of manufacture or calibration.

At a finer level, the choice of the transistor technology to use is dictated by the needed frequency of operation or compatibility with other circuitry such as needed in a system-on-a-chip (SOC) implementation.

There are many well known ways to implement the needed multipliers, amplifiers and operational trans conductive amplifiers (OTAs). The choice would be dictated by the need to optimize the sub-block for a particular process and application depending on tradeoffs and constraints such as circuit area, power, noise, accuracy, gain, linearity, supply voltage, speed, input and output impedances; and voltage swing. This implementation design work typically involves a tradeoff analysis and extends beyond the choice of circuit topology to bias levels and device sizing.

In any implementation ancillary circuitry for power supply conditioning, ESD resistance, substrate isolation, monitoring and self test will additionally be employed to meet the detailed design requirements.

Further, although a preferred embodiment has been described herein, the FFE can be implemented using standard (but typically lower speed) operational amplifiers. Circuit techniques that may be used to implement this include but are not limited to: monolithic integration, assembly of a collection of integrated circuits on a circuit board, as an assembly of discrete components on a circuit board or as a multichip module hybrid assembly.

Figure 7:
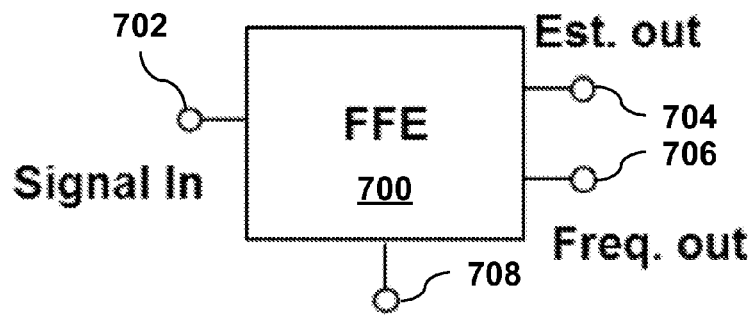
FIG. 7 is a functional block diagram of a frequency estimation circuit showing the signal input and optional forgetting factor control and the two main outputs, the narrow band sinusoidal estimate of the input signal which is the output of the main oscillator (Est. out) and the voltage signal that is proportional to the frequency estimate (Freq. out), according to an embodiment of the invention.

The PLL is one of the most commonly used circuits in electronics and the FFE can serve to replace it in many applications. The basic functional block diagram of the FFE as it pertains to these applications is shown in FIG. 7, which shows a functional block diagram of the FFE 700 including the signal input 702 and optional forgetting factor control 708 and the two main outputs, the narrow band sinusoidal estimate of the input signal which is the output of the main oscillator (Est. out) 704 and the voltage signal that is proportional to the frequency estimate (Freq. out) 706.

Figure 8:
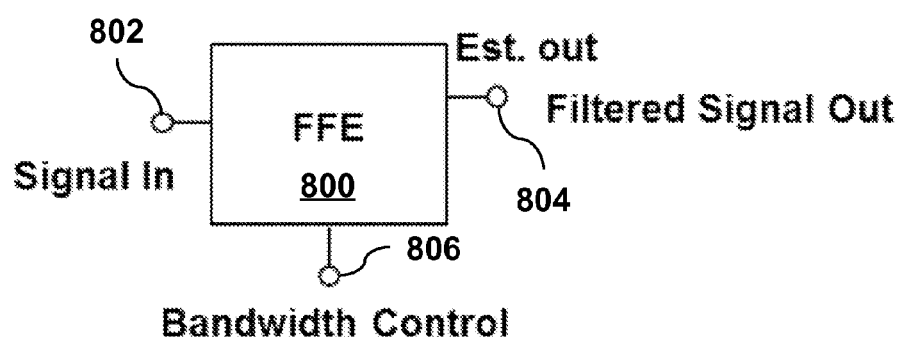
FIG. 8 is a functional block diagram illustrating a frequency estimation circuit used as a narrowband sinusoidal tracking filter, according to an embodiment of the invention.

Another use of the FFE is as a method to realize a narrowband sinusoidal tracking filter with optionally variable bandwidth. This application is shown in FIG. 8. In this application the Freq. out signal is not needed. Thus, FIG. 8 shows an FFE 800 used as a narrowband sinusoidal tracking filter with signal input 802, bandwidth control 806, and filtered signal (frequency estimate) output 804.

Figure 9:
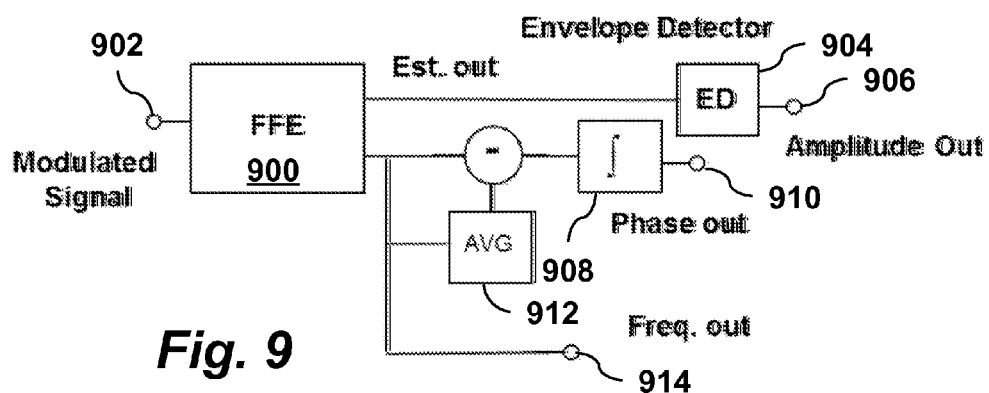
FIG. 9 is a functional block diagram illustrating a frequency estimation circuit with one example of additional circuitry used to provide estimations of phase amplitude and frequency modulation of the input signal, according to an embodiment of the invention.

The FFE can be used in communication systems at either the narrowband RF frequencies or in the baseband. This circuit can be used with a variety of modulation approaches used in these systems at both the transmitter and receiver. At its root the PLL in these systems is used as a parameter estimator to determine, amplitude, frequency and phase of signals. The FFE is an alternative method to provide this widely used function and can serve as a replacement for coherent demodulators in general. FIG. 9 shows the FFE with an illustration of one example of ancillary circuitry used to provide information (estimates of phase, amplitude, and frequency modulation) of the input signal. More specifically, FIG. 9 is a functional block diagram showing an FFE 900 with modulated signal input 902. The estimated signal output is fed to an envelope detector 904 which outputs an amplitude signal 906. The frequency output 914 of the FFE 900 is processed by an integrator 908 and averager 912 to produce a phase output 910.

The envelope detector (ED) block 904 used to measure amplitude is a standard circuit block that can be implemented in a wide variety of ways as is also the case for the integrator 908 used to generate the phase from the frequency signal. Here, for this method of phase estimation, a balanced symbol density is assumed, the averaging operation 912 followed by a subtraction removes the ambiguity of the additive constant inherent in the integration. Alternatively, we note that there are internal voltages in the FFE from which the instantaneous amplitude and phase may also be derived. The amplitude is given by $$\sqrt{\hat{x}_1^2 + \hat{x}_2^2},$$

and the instantaneous phase is given by $$\tan^{-1}\tfrac{\hat{x}_1}{\hat{x}_2}.$$

These can be generated from the FFE output signals using standard methods.

Modulations involving changes in amplitude, phase and frequency that this can be used for include the following:
Amplitude shift keying
Phase shift keying, including
   Binary phase shift keying (BPSK)
   Quadrature phase shift keying (QPSK)
   Offset quadrature PSK (OQPSK)
   m-ary PSK
   Differential PSK (DPSK)
Frequency Shift Keying, including
   Binary FSK
   m-ary FSK
   Minimum shift keying (MSK)
   Gaussian MSK (GMSK)
Quadrature amplitude modulation (QAM)

Note that the amplitude estimation capability is not one that is possessed by PLLs and that as such the FFE circuit is also particularly useful for amplitude modulated (AM) signals.

In every coherent receiver there is a need to estimate the carrier from a measurement of its noisy input signal. Typically this calls for a very narrowband PLL which exhibits acquisition problems. The FFE allows precise estimation with rapid acquisition. This is an application fulfilled by the use of the FFE as a narrowband tracking filter.

The FFE can also be used for the production of modulated signals for formats enumerated above. For example, with the FFE locked to an input reference sine wave the intentional modulation of the frequency estimate voltage, internal to the FFE, results in the frequency modulation of the output of the main oscillator. The frequency modulation of the FFE for short defined amount of time results in a phase modulated output from the main oscillator. Modification of voltages and currents at other internal nodes can be used to intentionally induce errors in the innovations which are compensated for by variation in the main oscillator waveform resulting in other means to vary the phase, amplitude and frequency of the main oscillator.

The combination of this circuit with a nonlinear regenerator can be used with suppressed carrier modulation approaches to implement clock recovery and with suitable decision circuitry to recover data.

Figure 10:
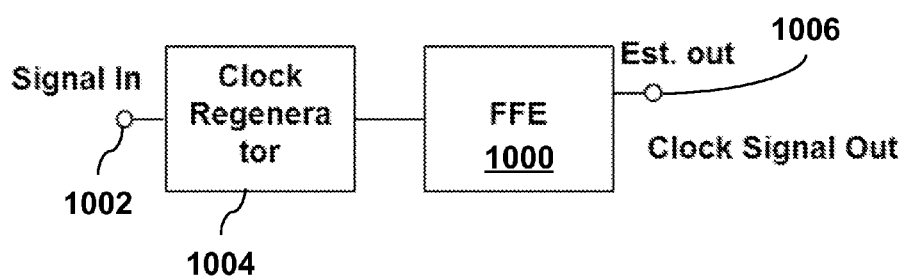
FIG. 10 is a functional block diagram illustrating clock recovery from a signal using a modulation that does not have a strong frequency component at the clock frequency, in this case a clock regenerator is used to generate a signal with a frequency component at the underlying clock frequency that is input to a frequency estimation circuit, according to an embodiment of the invention.

FIG. 10 is a functional block diagram showing use of an FFE 1000 for recovery of a clock signal 1006 from an input signal 1002 using a modulation that does not have a strong frequency component at the clock frequency. In this case a standard clock regenerator 1004 is used to generate a signal with a frequency component at the underlying clock frequency.

Another application of the FFE is to the speed control of AC motors. Here the FFE can be used as the estimate of the sensed frequency, quickly eliminating noise on the frequency sensor. The response of standard AC motor control can then be improved. A non-standard control procedure can also be used, which is to design the controller on the basis of a known frequency and use the separation principle of optimal control in state space. Then the estimated frequency can be used in the design in the place of the known frequency. All the advantages of the state space approach can be used to improve motor performance.

The fast response of the FFE would help in active vibration suppression as part of a control loop, using any device to provide influence on the vibration.

The recovery of clock from data is an application of the FFE for which it is particularly well suited. The FFE has a much faster acquisition time than alternate approaches which makes it particularly well suited for burst mode applications such as those in emerging passive optical networks and also for digital RF wireless transmission. High Q implementations such as those required for long distance optical fiber networks are possible provided care is taken in the matching of analog components. Simulation has shown that this circuit is robust to delay and mismatches. Other attractive features of this FFE are its rapidly configurable dynamics and the fact that it is based on an underlying algorithm that is optimal with regard to estimation in the face of noise. The FFE is suited for use in a number of specific applications, and in applications where the output of a PLL is one of the inputs to its phase detector this circuit is a direct and likely superior replacement. This makes the FFE suitable for many applications that presently might use a phased lock loop.

An outline of the main steps of the FFE method implemented by an analog hardware circuit for fast frequency estimation is shown in FIG. 12. In step 1200 the analog hardware circuit receives input signals having unknown frequency, amplitude and phase. In step 1202 the analog hardware circuit generates from the input signals estimates of state variables $x_1, x_2, x_3$ of a model oscillator by implementing in continuous time an extended Kalman filter that relates a generating frequency $\omega$ of the model oscillator to $x_3$ by an affine transformation $\omega=\omega_0+kx_3$, where k is a slope of a frequency error estimate and $\omega 0$ is a best estimate input signal frequency. In step 1204 the analog hardware circuit outputs a sinusoidal estimate of the model oscillator signal.

Variations, extensions, and alternate embodiments of the FFE are possible and envisioned by the inventors. These include implementations designed to meet the dynamic requirements using modifications to the underlying algorithm that provide gain terms to allow the following of input signal changes and loss terms that help to insure stability. First is described a generalized modification of the forgetting factor matrix that leads to gain terms followed by the addition of an $\epsilon$ term to insure stability. In applications where the model frequency changes value, a data window is added to forget long past data. This is standard practice in signal processing especially for communications transmission and reception and for spectrum analysis. Many approaches are possible, including exponential window or rectangular moving window. A preferred implementation uses an exponential window, implemented by the addition of a forgetting factor matrix to the extended Kalman filter Riccati equation that is a pseudo process noise variance. These additional terms are implemented in circuitry by any number of approaches outlined previously for the forgetting factor. The forgetting factor A does not have to be a constant, as used in the following, but can depend on time and/or be nonlinear in any of the variables. This addition represents a generalization of the forgetting factor mentioned previously.

With this addition the Riccati equation becomes $$\frac{dP}{dt} = AP + PA^T - PC^TR^{-1}CP + \Lambda$$

where $$P = \begin{bmatrix} P_{11} & P_{12} & P_{13} \\ P_{12} & P_{22} & P_{23} \\ P_{13} & P_{23} & P_{33} \end{bmatrix} \text{ and } \Lambda = \begin{bmatrix} \lambda_{11} & \lambda_{12} & \lambda_{13} \\ \lambda_{12} & \lambda_{22} & \lambda_{23} \\ \lambda_{13} & \lambda_{23} & \lambda_{33} \end{bmatrix}$$

are symmetric, P is positive definite and $\Lambda$ is non-negative definite forgetting factor matrix and chosen as a design variable according to the variation in the model frequency. Above, A is F=df/dx as in the FFE equations previously described except possibly including the stabilization terms now described below.

For every positive definite sub-matrix of A, there is added the negative of a corresponding positive definite sub-matrix to the A matrix in the Riccati equation to preserve stability. The A matrix and corresponding addition to the A matrix can be time varying and/or nonlinear to influence the shape of the window. For example in the simplest case of demodulation of a communications signal, if $$\Lambda = \lambda^2 \begin{bmatrix} 0 & 0 & 0 \\ 0 & 0 & 0 \\ 0 & 0 & 1 \end{bmatrix},$$

then the sigma integrator becomes $$dP_{33}/dt = \lambda^2 - R^{-1} P_{13}^2 - P \epsilon P_{33}$$

and $-\epsilon$ is added to the lower right hand corner of the A matrix in the Riccati equation. Then $\epsilon$ is chosen such that it is much less than 1/10 of the carrier frequency, so that the carrier frequency being estimated is not much affected by the addition of $\epsilon$ and yet the FFE is stable. The full A matrix can be used to improve performance. Within the FFE, the circuit implementation of this addition to the A matrix can be realized by the inclusion of lossy elements or reliance on the normal energy loss mechanisms present in actual circuit elements. The actual values used will be determined by the performance specifications for the different applications.

In an alternate embodiment, the main oscillator block can be implemented with a damping factor p in the frequency update equation as follows:

$$d\hat{x}_3/dt = -\rho \hat{x}_3 + P_{13}(y - \hat{x}_1).$$

It is significant to note that multiple instances of the FFE circuit can be combined in series, in parallel, or in a combination of series and parallel to produce a larger circuit with more sophisticated capabilities.

In another embodiment, the FFE signal model can be extended in a straightforward way to allow for the simultaneous estimation of multiple frequencies present in the input signal. In particular a single more complicated FFE can perform estimation of a set of n frequencies $\{\omega_i | i=1, 2, \ldots, n\}$. Define 2-vectors $\{x_i | i=1, 2, \ldots, n\}$, 2×2 matrices $\{A_i | i=1, 2, \ldots, n\}$, and an n-vector $\omega$ as follows:

$$x_i = \begin{pmatrix} x_{i1} \\ x_{i2} \end{pmatrix} \text{ and } \frac{dx_i}{dt} = \omega_i \begin{bmatrix} 0 & 1 \\ -1 & 0 \end{bmatrix} x_i = A_i x_i \text{ and } \omega = \begin{pmatrix} \omega_1 \\ \vdots \\ \omega_n \end{pmatrix}$$

Then the signal model becomes $$\frac{d \begin{pmatrix} x_1 \\ \vdots \\ x_n \\ \omega \end{pmatrix}}{dt} = \begin{bmatrix} A & \cdots & 0 & 0 \\ \vdots & \ddots & 0 & 0 \\ 0 & 0 & A_n & 0 \\ 0 & 0 & 0 & 0 \end{bmatrix} \begin{pmatrix} x_1 \\ \vdots \\ x_n \\ \omega \end{pmatrix} \text{ and }$$

$$y = (1010 \ldots 1000 \ldots 0) \begin{pmatrix} x_1 \\ \vdots \\ x_n \\ \omega \end{pmatrix} + v$$

The above signal model can be used to obtain a complicated FFE that can be designed using circuitry similar to the single frequency FFE. If there are multiple input signals $y_j(t)$ containing sinusoids, these are also easily put into vector notation and incorporated into the signal model, which gives a vector block input that generalizes the FFE. The above model gives the general case for estimating multiple frequencies. However, in special cases, the complicated FFE given above becomes simple, as we now describe.

In the case where the frequencies are well separated, the fast frequency estimator can have the estimates for each of the frequencies $\omega_i$ restricted to its individual band of frequencies. This can be accomplished easily in the circuitry. Then asymptotically the above model decouples into a series connection of multiple fast frequency estimators. For example, consider an input signal y(t) that has two widely separated frequencies to be estimated. A first FFE in the series estimates the carrier, giving the estimated sinusoid as $\hat{x}_1(t)$. Then a second FFE in the series has input $y_2(t)=y(t)-\hat{x}_1(t)$. Therefore the second FFE in series estimates the signal on the carrier, which corresponds to a suppressed carrier modulation scheme. Perhaps this might be called a super-duper heterodyne. For spectrum analysis, or possibly phased array radar, or electronic warfare or electronic countermeasure applications, many frequencies can be estimated using n FFEs.

In another variation, for applications to spread spectrum clocking (SSC), the clock frequency is modulated to reduce electromagnetic interference (EMI). In this scenario, the low bandwidth CDR cannot be used. However, the FFE with forgetting factors can be used to track the clock and filter jitter in SSC.

It should be noted that, in the original presentation of the FFE above, the underlying FFE equations were written assuming a particular set of state variables for the oscillator and one circuit implementation for this system was given. It should be noted that the principles of the invention are not restricted to these illustrative embodiments. In particular, the system could also be implemented using an alternate choice of state variables. For example, an oscillator may be used with the more usual frequency and amplitude control inputs. However, this does make the state variable transformation nonlinear.

In another variation, shown in FIG. 11, the frequency range of the FFE 1100 may be extended by its combination with mixers 1106 and 1108. In the figure, $V_{in}$ 1102 is the input signal, $V_f$ 1104 is the reference clock, and $V_{out}$ 1110 is the final output signal. The first single sideband mixer (SSB1) 1106 is used to frequency down-convert the input signal 1102. The SSB2 is used to recover the original frequency by up-conversion.

Figure 13:
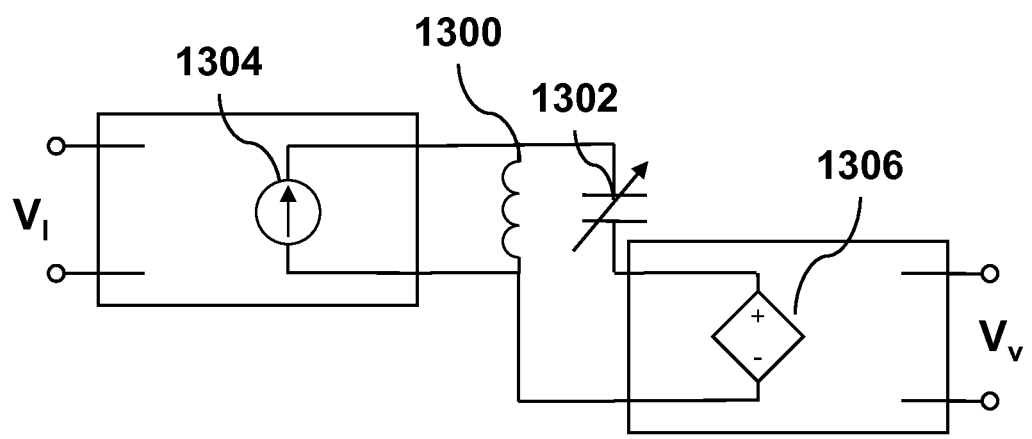
FIG. 13 is a circuit diagram of an implementation of an oscillator, according to an embodiment of the invention, such as the main oscillator of FIG. 1.

There are a number of alternate implementations available for the oscillators in the FFE besides the one discussed above. The use of an active inductor in that transconductor implementation is convenient because all of the oscillator state variables are available as voltages. Alternately, however, an L-C oscillator can be implemented as shown in FIG. 13. Here the values of the state variables are represented by the magnitude of the current flowing through the inductor 1300 and the magnitude of the voltage across the variable capacitor 1302. The oscillator is driven by the dependent sources, 1304 and 1306, shown that can be implemented in any number of ways. Here the oscillator is shown as controlled by voltage inputs $V_I$ and $V_V$ but current drives could be used as well. Using this implementation as the main oscillator, the driving signals are the appropriate gain times the innovations. Such an oscillator could be used for the other two oscillators in the FFE as well. The signal corresponding to $x_3$ is used to control the frequency via a variable capacitance in this implementation. For high frequency implementation or where a floating dependent source is desired, transformers driven by the appropriate current or voltage source could be used. Here in FIG. 13, $V_I$ is the input voltage controlling the dependent current source 1304. The dependent voltage source 1306 is controlled by $V_V$. Together with the variable capacitor control 1302 these inputs control the oscillators amplitude, phase and frequency.

Other oscillator implementations with different excitations may be used if the circuit implementation is derived from the EKFFE mathematical model when expressed using a different set of basis states.

The invention claimed is:

1. A method implemented by an analog hardware circuit for fast frequency estimation, the method comprising:
    receiving by the analog hardware circuit input signals having unknown frequency, amplitude and phase;
    generating by the analog hardware circuit from the input signals estimates of state variables $x_1$, $x_2$, $x_3$ of a model oscillator;
    outputting by the analog hardware circuit a sinusoidal estimate of the model oscillator signal;
    wherein the analog hardware circuit generates the estimates by implementing in continuous time an extended Kalman filter;
    wherein the extended Kalman filter relates a generating frequency $\omega$ of the model oscillator to $x_3$ by an affine transformation $\omega=\omega_0+kx_3$, where k is a slope of a frequency error estimate and $\omega 0$ is a best estimate input signal frequency.

2. The method of claim 1 wherein the extended Kalman filter uses a balanced state space representation in continuous time.

3. The method of claim 1 wherein an error variance matrix P of the extended Kalman filter is limited to a cone of positivity.

4. The method of claim 1 wherein the analog hardware circuit comprises a main oscillator circuit block, a P matrix circuit block that produces an error covariance of the state variable estimates, a K matrix circuit block that produces an optimal Kalman gain, and a sigma integrator circuit block that produces a variance of $x_3$.

5. The method of claim 1 wherein the analog hardware circuit comprises transconductance amplifiers and transconductance multipliers.

6. The method of claim 1 wherein the analog hardware circuit is a complementary metal-oxide-semiconductor (CMOS) integrated circuit (IC).

7. The method of claim 1 wherein the method further comprises receiving by the analog hardware circuit a forgetting factor (bandwidth) control signal.

8. The method of claim 1 wherein the method further comprises outputting by the analog hardware circuit a voltage proportional to a frequency estimate.

9. The method of claim 1 wherein the extended Kalman filter includes a forgetting factor matrix in a Riccati equation.

10. The method of claim 1 wherein the extended Kalman filter includes an additional $\epsilon$ term in an A matrix of a Riccati equation.

11. The method of claim 1 wherein the extended Kalman filter includes a frequency update equation including a damping factor $\rho$.

12. The method of claim 1 wherein the analog hardware circuit comprises multiple subcircuits connected to each other in series, in parallel, or in a combination of series and parallel; wherein each subcircuit performs the steps of claim 1.

13. The method of claim 1 wherein the input signals have multiple unknown frequencies; and further comprising outputting multiple sinusoidal estimates of model oscillator signals corresponding to the input signals.

14. The method of claim 1 further comprising receiving multiple input signals having respective unknown frequencies, amplitudes, and phases; and outputting multiple sinusoidal estimates of model oscillator signals corresponding to the multiple input signals.

15. The method of claim 1 wherein the analog hardware circuit comprises an input mixer that frequency down-converts the input signals, and an output mixer that frequency up-converts the sinusoidal estimate.

16. The method of claim 1 wherein the extended Kalman filter uses alternate state variables and nonlinear transformations of frequency, amplitude and phase.

* * * * *